United States Patent
Donofrio et al.

(10) Patent No.: US 7,910,945 B2
(45) Date of Patent: Mar. 22, 2011

(54) NICKEL TIN BONDING SYSTEM WITH BARRIER LAYER FOR SEMICONDUCTOR WAFERS AND DEVICES

(75) Inventors: Matthew Donofrio, Raleigh, NC (US); David B. Slater, Jr., Durham, NC (US); John A. Edmond, Cary, NC (US); Hua-Shuang Kong, Cary, NC (US)

(73) Assignee: Cree, Inc., Durham, NC (US)

( * ) Notice: Subject to any disclaimer, the term of this patent is extended or adjusted under 35 U.S.C. 154(b) by 55 days.

(21) Appl. No.: 11/844,127

(22) Filed: Aug. 23, 2007

(65) Prior Publication Data

US 2008/0210971 A1    Sep. 4, 2008

Related U.S. Application Data

(63) Continuation-in-part of application No. 11/428,158, filed on Jun. 30, 2006.

(51) Int. Cl.
*H01L 33/00* (2010.01)
*H01L 23/40* (2006.01)

(52) U.S. Cl. .............. 257/99; 257/79; 257/81; 257/744; 257/745

(58) Field of Classification Search .................. 257/744, 257/745
See application file for complete search history.

(56) References Cited

U.S. PATENT DOCUMENTS

| | | | |
|---|---|---|---|
| 3,648,357 A | 3/1972 | Green, Jr. | |
| 4,418,857 A | 12/1983 | Ainslie et al. | |
| 5,197,654 A | 3/1993 | Katz et al. | |
| 5,234,153 A | 8/1993 | Bacon et al. | |
| 6,250,541 B1 | 6/2001 | Shangguan et al. | |
| 6,335,263 B1 | 1/2002 | Cheung et al. | |
| 6,527,881 B2 | 3/2003 | Kanematsu et al. | |
| 6,744,142 B2 | 6/2004 | Lie et al. | |
| 6,930,389 B2 | 8/2005 | Huang | |
| 7,023,089 B1 | 4/2006 | Lu | |
| 2001/0004534 A1 | 6/2001 | Carter-Coman et al. | |
| 2002/0030198 A1 | 3/2002 | Coman et al. | |
| 2002/0045330 A1* | 4/2002 | Angst et al. ................... | 438/584 |
| 2004/0201029 A1* | 10/2004 | Yamane et al. ................. | 257/99 |

(Continued)

FOREIGN PATENT DOCUMENTS

GB        234648 A        6/1925

(Continued)

OTHER PUBLICATIONS

Neumann et al., "The Ternary System Au-Ni-Sn", 1996, Journal of Solid State Chemistry 123, p. 203-207.*

(Continued)

*Primary Examiner* — N Drew Richards
*Assistant Examiner* — Michael Jung
(74) *Attorney, Agent, or Firm* — Myers Bigel Sibley & Sajovec (57) ABSTRACT

A light emitting diode structure is disclosed that includes a light emitting active portion formed of epitaxial layers and carrier substrate supporting the active portion. A bonding metal system that predominates in nickel and tin joins the active portion to the carrier substrate. At least one titanium adhesion layer is between the active portion and the carrier substrate and a platinum barrier layer is between the nickel-tin bonding system and the titanium adhesion layer. The platinum layer has a thickness sufficient to substantially prevent tin in the nickel tin bonding system from migrating into or through the titanium adhesion layer.

20 Claims, 10 Drawing Sheets

U.S. PATENT DOCUMENTS

| | | | |
|---|---|---|---|
| 2004/0232439 A1* | 11/2004 | Gibb et al. | 257/103 |
| 2005/0072835 A1* | 4/2005 | Choi et al. | 228/180.22 |
| 2006/0049411 A1 | 3/2006 | Nakamura et al. | |
| 2006/0060872 A1 | 3/2006 | Edmond et al. | |
| 2006/0060874 A1 | 3/2006 | Edmond et al. | |
| 2006/0060877 A1 | 3/2006 | Edmond et al. | |
| 2006/0060879 A1 | 3/2006 | Edmond | |
| 2006/0061974 A1 | 3/2006 | Soga et al. | |
| 2006/0128118 A1 | 6/2006 | Nagahama et al. | |
| 2006/0163590 A1 | 7/2006 | Erchak et al. | |
| 2006/0189098 A1 | 8/2006 | Edmond | |
| 2007/0141806 A1 | 6/2007 | Uemura et al. | |
| 2008/0003777 A1 | 1/2008 | Slater et al. | |

FOREIGN PATENT DOCUMENTS

| | | |
|---|---|---|
| JP | 2006-140186 | 6/2006 |

OTHER PUBLICATIONS

Hsu et al., "Phase equilibria of the Sn-Ag-Ni ternary system and interfacial reactions at the Sn-Ag/Ni joints", 2004, Acta Materialia 52, p. 2541-2547.*

International Search Report of foreign counterpart application No. PCT/US2008/072855; mailing date Dec. 3, 2008; 3 pages.

Lee, et al, "Study of Ni as a barrier metal in AuSn soldering application for laser chip/submount assembly," J. Appl. Phys. vol. 72 No. 8, Oct. 15, 1992, pp. 3808-3815.

Labie et al, "Solid state diffusion in Cu-Sn and Ni-Sn diffusion couples with flip-chip dimensions," Intermetallics 15 (Sep. 26, 2006) 396-403.

Correspondence dated Jul. 8, 2010 from Japanese associate forwarding office action Japanese Patent Application No. 2007-171846, 3 pages.

Search Report corresponding to ROC(Taiwan) Patent Application No. 096123546.

* cited by examiner

Fig. 6--Pre-Sputter

Fig. 7 (30 seconds)

Fig. 8 (90 seconds)

Fig. 11 (EDS at location 1)

Fig. 12 (EDS at location 3)

NICKEL TIN BONDING SYSTEM WITH BARRIER LAYER FOR SEMICONDUCTOR WAFERS AND DEVICES

RELATED APPLICATIONS

This application is a continuation in part of Ser. No. 11/428,158 filed Jun. 30, 2006 for, "Nickel Tin Bonding System for Semiconductor Wafers and Devices." The contents of this application are incorporated entirely herein by reference.

BACKGROUND

The present invention relates to the structure and composition of metal bonding systems used to attach substrate wafers carrying light emitting diodes (LEDs) to other substrate wafers during LED manufacture.

Light emitting diodes (LEDs) are a class of photonic semiconductor devices that convert an applied voltage into light by encouraging electron-hole recombination events in an appropriate semiconductor material. In turn, some or all of the energy released in the recombination event produces a photon.

A typical LED includes p-type and n-type epitaxial layers ("epilayers") that form a p-n junction through which current injection occurs to produce the recombination events. These epilayers are typically grown on a substrate of the same or a different semiconductor. Epilayers can be produced with relatively high crystal quality and thus enhance the quality and operation of the resulting devices. The substrate portion of the device may not require the same level of quality, or in some cases, substrates formed of the same material as one or more of the epilayers are not readily available (or available at all).

Because of their wide bandgap and direct transition characteristics, the Group III nitride materials are favored for shorter wavelength light emitting diodes; i.e., those that emit in the blue, violet, and ultraviolet portions of the electromagnetic spectrum. The Group III nitride materials can, either in conjunction with diodes of other colors or with phosphors, produce white light. At the same time, Group III nitride substrate crystals of an appropriate size and quality are difficult or impossible to obtain. As a result, LEDs based on the Group III nitride material system typically include Group III nitride epilayers on sapphire or silicon carbide (SiC) substrates.

For a number of reasons, when the epitaxial layers of light-emitting semiconductor materials are formed (typically by chemical vapor deposition ("CVD") growth) on a substrate, the resulting precursor structure can be in some cases added to an additional substrate. The second substrate may be other than a semiconductor or if it is a semiconductor, it is not necessarily present for semiconducting purposes. For example, in commonly assigned and co-pending U.S. Patent Application Publication Number 20060060877, a second substrate is used for mounting and fabrication purposes and to form a portion of a final LED structure. No. 20060060877 is incorporated entirely herein by reference. As set forth therein and elsewhere, the manufacture of certain types of LEDs includes one or more steps to reduce the thickness of the original substrate (e.g., because the original substrate is thicker in order to make the initial manufacturing steps easier). Related background is set forth in commonly assigned U.S. Patent Application Publications Nos. 20060049411, 20060060872, 20060060874, and 20060060879, and the contents of each of these is likewise incorporated entirely herein by reference.

In other structures, light emitting diodes are mounted to second substrates in order to reverse (flip) their normal orientation. Stated differently, in a typical orientation, the substrate is mounted to a lead frame and the epitaxial layers form the emitting face of the LED. In a flip chip orientation, however, the epitaxial layers are mounted towards the lead frame and the substrate provides the light emitting surface of the LED. Various steps in the process of manufacturing such flip chip diodes can require that the LED-carrying substrate wafer be joined to another substrate wafer either temporarily or permanently. In some flip-chip embodiments, the LED-carrying substrate wafer is removed from the epitaxial layers after the epitaxial layers are mounted to the temporary or permanent substrate wafer.

The conventional manner of joining the LED-carrying substrate wafer (also referred to herein as the "growth" wafer or substrate) to another substrate wafer (the "carrier" wafer or substrate) includes the use of various metal layers in a manner either identical or analogous to soldering or brazing when permanent bonding is desired. In many circumstances, a layer of titanium (Ti) is formed or deposited onto the respective surfaces to be joined, and then additional layers of bonding metals are added to form a bonding metal structure on each of the first and second substrates (sometimes referred to as the donor and acceptor substrates).

For numerous reasons, gold (Au) has historically been a predominant element in these bonding metal layers. Because it resists oxidation and other chemical reactions (which makes it, of course, historically valuable for jewelry and related items), gold also is attractive for its corrosion resistance; i.e., avoiding undesired reaction with its surroundings. Gold's ability to form relatively low melting point alloys or compounds (with respect to pure gold) also makes it ideal for soldering purposes.

Nevertheless, the expense of gold, even in small amounts used in individual semiconductor devices, becomes significant when multiplied over the millions of individual light emitting diodes that the market now demands.

As another factor, soldering wafers to one another requires some application of heat. Thus, a soldering step used to join an LED substrate wafer to a second substrate wafer will heat the LEDs to some extent. As is well understood by those of ordinary skill in this art, raising the temperature of the light emitting semiconductor epitaxial layers raises the corresponding probability of generating defects in the epitaxial layers. Typically, gold-tin based soldering (bonding, brazing) systems require temperatures above about 300° C. Although epitaxial layers of, for example, Group III nitride materials, can theoretically withstand such temperatures, in reality these temperatures significantly increase the probability that the bonding step will generate noticeable defects.

As yet an additional factor, when individual LEDs are separated from a wafer and mounted on a lead frame (e.g., to form a lamp), they are typically mounted on the lead frame with another soldering step. If the LED already contains a solder bond, the existing solder bond should desirably remain unaffected by the temperatures required to solder the wafer-bonded chip to the lead frame. Thus, the temperature at which the LED can be soldered to the lead frame will be limited by the melting temperature that the substrate-substrate bond. Stated differently, the thermal characteristics of the substrate-substrate bonding metallurgy may unfavorably limit the type of solder that can be used to join an individual LED to an individual lead frame.

Accordingly, a need exists for taking advantage of the improved characteristics of nickel-tin bonding systems while avoiding the problems raised when tin migrates through the nickel layer to form undesired species such as free tin, titanium tin alloys, or other thermally unstable intermetallic compounds.

SUMMARY

In one aspect the invention is a light emitting diode structure that includes a light emitting active portion formed of epitaxial layers and a carrier substrate for supporting the active portion. A bonding metal system that predominates in nickel and tin joins the active portion to the carrier substrate. At least one titanium adhesion layer is between the active portion and the carrier substrate, and a platinum barrier layer is between the nickel tin bonding system and the titanium adhesion layer. The platinum layer has a thickness sufficient to substantially prevent tin in the nickel tin bonding system from migrating into or through the titanium adhesion layer.

In another aspect, the invention is a light emitting diode precursor structure that includes a light emitting active portion formed of at least two epitaxial layers of Group III nitride and a carrier substrate for supporting the active portion. A bonding metal structure is between the active portion and the carrier substrate. The bonding metal structure includes a middle layer of tin between two outer layers of nickel with the relative amount of tin being greater than the amount would be consumed by reacting with either nickel layer alone, but less than the amount that would provide a functional reaction excess of tin over both nickel layers. A titanium adhesion layer is between the active portion and the bonding metal structure and a platinum barrier layer is between the titanium adhesion layer and the bonding metal structure for preventing tin in the bonding structure from migrating into or thorough the titanium adhesion layer.

In yet another aspect, the invention is a precursor structure for a light emitting diode that includes a growth structure and a carrier structure for being joined together. The growth structure includes a growth substrate, light emitting epitaxial layers on the growth substrate, and a metal bonding system on the epitaxial layers for joining to the carrier structure. The growth structure metal bonding system is formed predominately of a layer of nickel and a layer of tin, with an adhesion layer of titanium between the nickel layer and the epitaxial layers and a platinum barrier layer between the titanium adhesion layer and the nickel layer. The carrier structure includes a carrier substrate, a titanium adhesion layer on the carrier substrate, a platinum barrier layer on the titanium layer, and a nickel layer on the platinum layer for joining to the growth structure. When the bonding metal system on the growth structure and the nickel layer on the carrier structure are joined and heated, the respective platinum barrier layers prevent tin from migrating into or through either of the titanium adhesion layers.

In another aspect, the invention is a light emitting diode structure on a lead frame. In this aspect, the invention includes a light emitted emitting active portion formed of epitaxial layers, a carrier substrate for supporting the active portion, and a lead frame or equivalent structure attached to the carrier substrate with a solder composition. A bonding metal system joins the active portion to the carrier substrate in the barrier layer is between the bonding metal system and the epitaxial layers. The barrier layer is formed of the material and has a thickness sufficient to substantially preclude the formation or migration of free metals or alloys that have melting points lower than the melting point of the solder composition.

The foregoing and other objects and advantages of the invention and the manner in which the same are accomplished will become clearer based on the followed detailed description taken in conjunction with the accompanying drawings.

DETAILED DESCRIPTION

The present invention is an improved metal bonding system that is particularly useful in certain structures of light emitting diodes.

The nature and operation of individual LED devices are well understood in the art and will not be repeated in detail herein. Appropriate references include Sze, PHYSICS OF SEMICONDUCTOR DEVICES, 2d Edition (1981); Schubert, LIGHT-EMITTING DIODES, Cambridge University Press (2003) and, Zetterling, PROCESS TECHNOLOGY FOR SILICON CARBIDE DEVICES, Electronic Materials Information Service (2002)

The bonding system set forth in the '158 application successfully addresses a number of the issues raised when gold predominates by forming a bonding system predominantly of nickel (Ni) and tin (Sn). As set forth therein, although the melting point of tin is relatively low (232° C.) alloys formed of nickel-tin compounds that include between about 30 and 70 weight percent tin have melting points that are all above 750° C. Thus, the bonding system described in the '158 application successfully meets the criteria of withstanding thermal excursions in the 250-300° C. range that take place during fabrication steps that are carried out after wafers are bonded to one another.

Devices formed using the nickel-tin bonding system in the '158 application have achieved many of the desired goals. Nevertheless, as their use has increased it has been discovered that tin unexpectedly migrates through the adjacent nickel layers. This migration appears to take place even when the proportional amounts of tin and nickel are such that all of the tin would be expected to be present in the form of the nickel-tin alloy. Several resulting problems have been observed. First, when the migrating tin reaches the titanium adhesion layer that is typically present (e.g., Paragraph 0047 of the '158 application) it can form titanium-tin compounds that are thermally unstable at the temperatures required for the later fabrication steps. Such compounds can and will react in the solid state during later fabrication steps and as they undergo thermal aging as the end device is used. These intermetallic compounds can also cause delamination problems even without actually melting. Second, the tin can migrate and form portions of free tin adjacent the titanium adhesion layers. Because of tin's 232° C. melting point, such portions of free tin or thermally unstable alloys create positions in the structure that have a higher propensity for separating at the fabrication temperature steps.

Theoretically, increasing the amount of nickel in the layer adjacent a tin layer should successfully preclude any given amount of tin from migrating through the nickel layer. In practice, however, tin continues to migrate even when the thickness of the adjacent nickel layers is doubled. This indicates that the tin has a reasonably high mobility in nickel and that thickness alone may not solve the problem. More importantly, merely adding thickness to a bonding layer (and thus to LEDs, lamps and packages that incorporate the bonding layer) offers no particular structural or electronic advantage. Although a nickel layer could probably be formed that absolutely precluded tin from migrating, its relative thickness would raise corresponding disadvantages such as fabrication difficulty, size, and cost.

Figure 1:
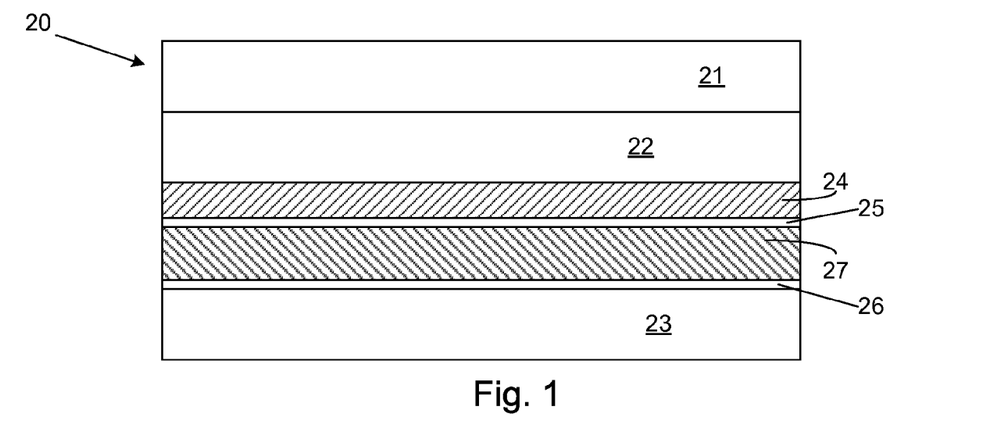
FIG. 1 is a cross sectional schematic view of an LED structure with a nickel-tin bonding system.

In one sense, the invention can be understood as an improvement in the structures described in the co-pending and previously incorporated '158 application. Accordingly, FIG. 1 is representative of such a light emitting diode structure broadly designated at 20. The diode 20 includes respective epitaxial layers 21 and 22 typically formed of gallium nitride or another appropriate Group III Nitride. The epitaxial layers are supported by a carrier substrate 23 through a system of barrier metals 24 a pair of titanium adhesion layers 25 and 26 and the nickel tin bonding system 27 described in the '158 application. In exemplary embodiments, the carrier substrate is selected from the group consisting of aluminum, copper silicon and silicon carbide, with silicon being prevalent in a number of examples.

It will be understood that the description and figures herein are exemplary rather than limiting of the diode structures that can benefit from the present invention. Thus, although LEDs can have structures as basic as one p-type and one n-type layer of GaN, LEDs can also be formed from multiple epitaxial layers, some of which may include InGaN as well as buffer layers that often include AlGaN. The light emitting structures can include p-n junctions, quantum wells, multiple quantum wells and superlattice structures.

It will also be understood that structural terms such as, "on," "above," and "between," are used herein in a broad sense to indicate relative positions are relationships rather than (for example) immediate contact between the recited items. In any given portion of the description, the meaning will be clear in context.

Figure 2:
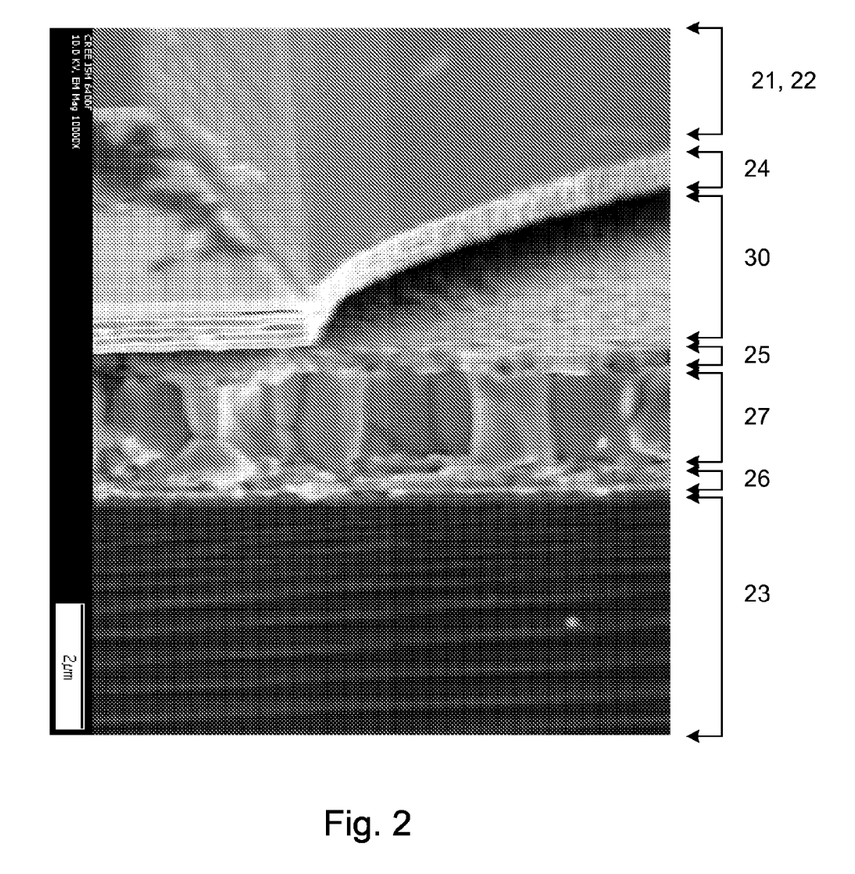
FIGS. 2-5 are cross-sectional photographs of structures with nickel-tin bonding systems.

FIG. 2 is a cross-sectional micrograph of a light emitting diode having the basic structure schematically illustrated in FIG. 1. The common elements are commonly numbered with FIG. 1. Accordingly, the gallium nitride epitaxial layers are indicated by the brackets 21, 22, the barrier metals at 23, the titanium layers at 25 and 26, the nickel-tin bonding system at 27 and the silicon substrate at 23. FIG. 2 also illustrates, however, a void area 30, certain portions of which appear as a dark shadow immediately under the barrier layers 23 and other portions of which appear as the light gray surface above the titanium layer 25. As set forth earlier, the void space results from the delamination that occurs when tin migrates and reacts with the titanium layers 25 and 26, or forms free tin, or forms other undesired thermally unstable intermetallic compounds.

Figure 3:
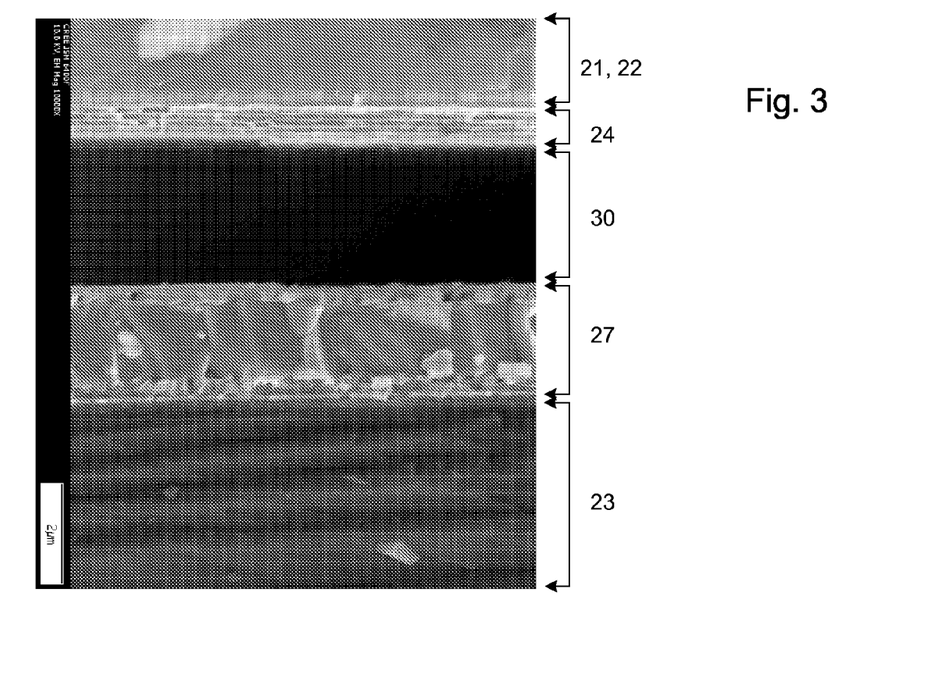

FIG. 3 is another view of the same structure as FIG. 2 but with a slightly different orientation that emphasizes the void 30 created by the delamination.

Figure 4:
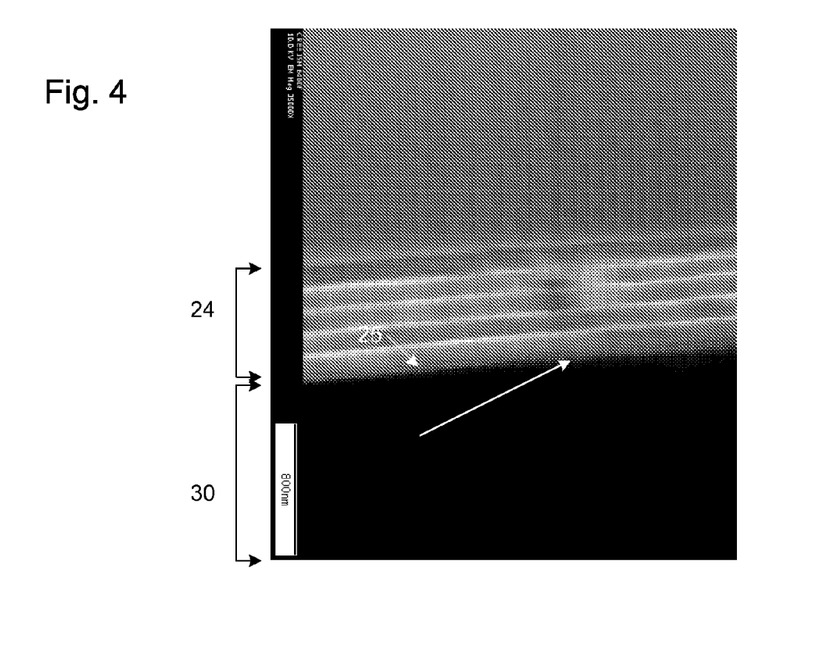

FIG. 4 is an enlargement of portions of FIG. 3 and illustrates the residual titanium layer 25 just below the barrier metal layers 24. The void space created by the delamination is again visible as the dark space 30.

Figure 5:
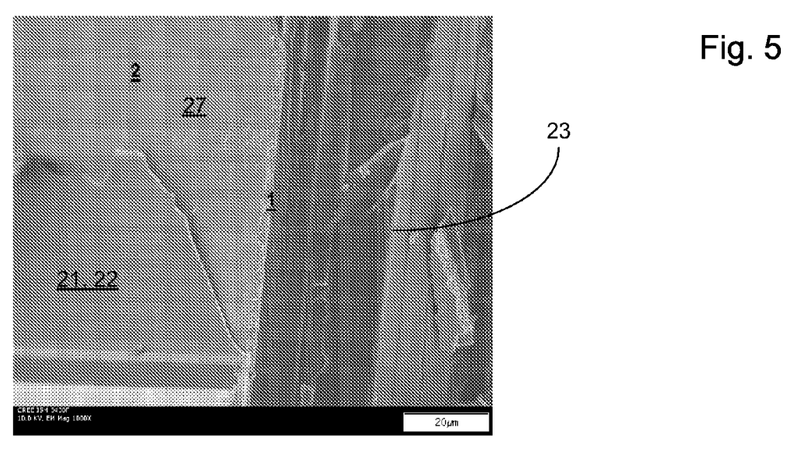

FIGS. 5 through 8 confirm the nature of the problem solved by the present invention. FIG. 5 is yet another view of a structure according to the '158 application, but in an orientation turned approximately (but not exactly) 90 degrees from FIGS. 2, 3 and 4. An Auger spectroscopic analysis was carried out on the portion of the delaminated surface labeled as "2." In FIG. 5, a delaminated portion of the epitaxial layers 21, 22 appear in the lower left-hand corner, the top of the nickel tin bonding metal system 27 corresponds to the target designated "2" and the silicon substrate is again designated at 23.

Figure 6:
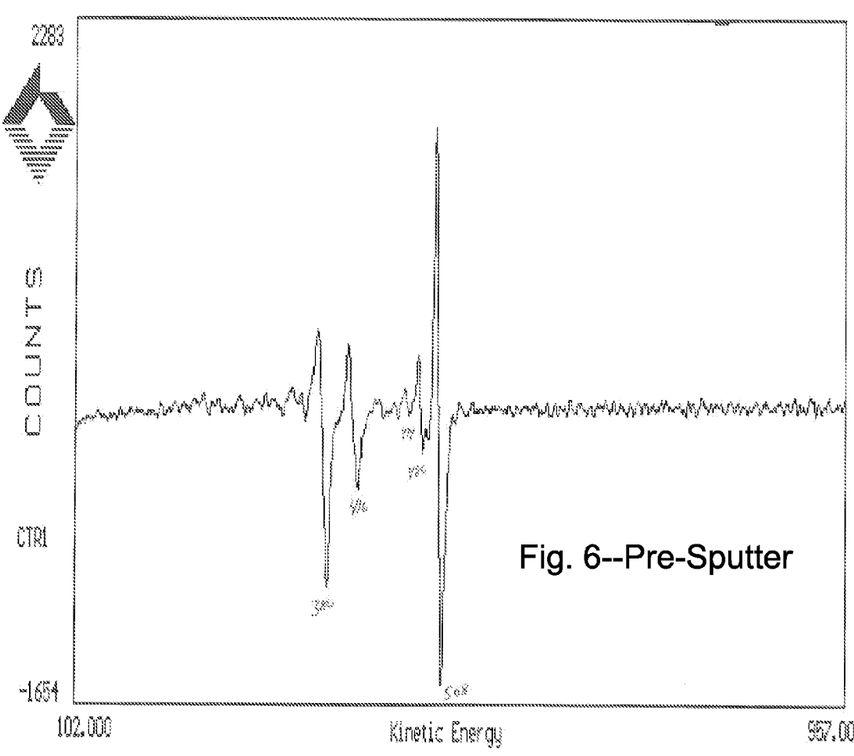
FIGS. 6, 7 and 8 are Auger spectra of the surface illustrated in FIG. 5 taken after successive bombardments with argon.

The Auger spectrum of FIG. 6 was taken prior to any sputter bombardment with argon. It indicates the presence of titanium at the kinetic energy values of 380 and 416 electron volts (eV).

Figure 7:
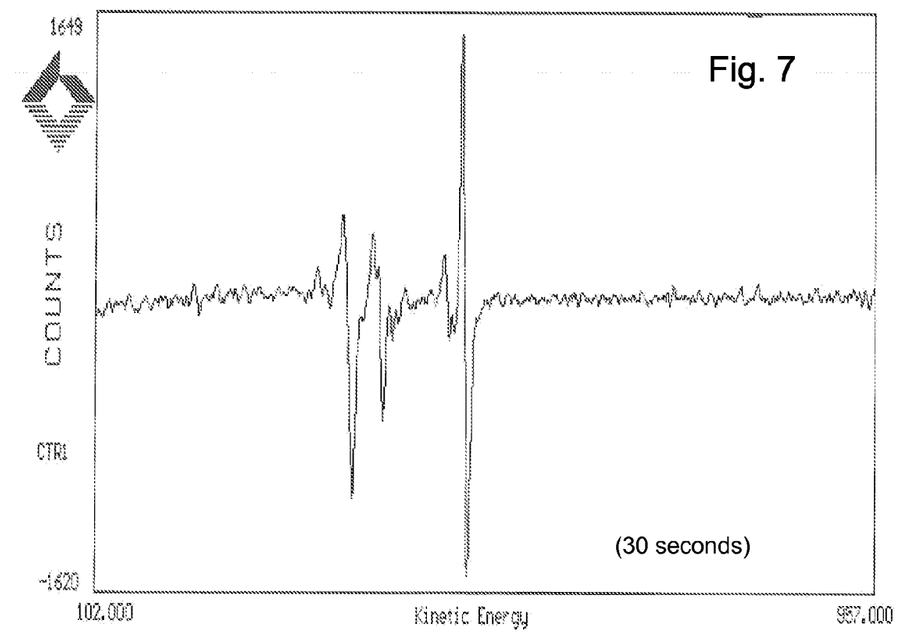

FIG. 7 shows the spectrum from the same target area after 30 seconds of argon sputtering at a reference sputter rate in gold of about 5 angstroms per second. The large peak at approximately 510 eV indicates the presence of oxygen from the native oxide that forms on the layer when the delaminated portion is exposed to the atmosphere. In comparison to FIG. 6, peaks representing tin are becoming evident at approximately 423 and 435 eV, but peaks that would be expected for nickel (for example at about 700 eV) are completely absent. This spectrum demonstrates that tin and titanium are present at the surface (rather than nickel and tin), which in turn indicates that the nickel is neither holding the tin as an alloy nor preventing tin from migrating to or through the titanium layer.

Figure 8:
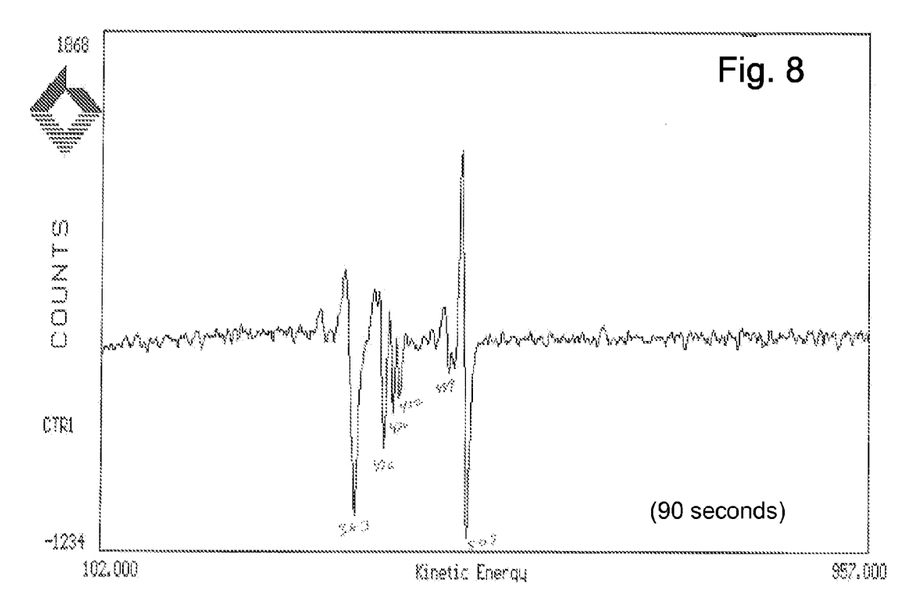

FIG. 8 is the same spectrum taken after 90 seconds of bombardment and in which peaks characteristic of tin at 426 and 432 eV are evident. FIG. 8 again illustrates the absence of nickel, thus confirming the results of FIG. 7 and the existence of the problem.

Figure 9:
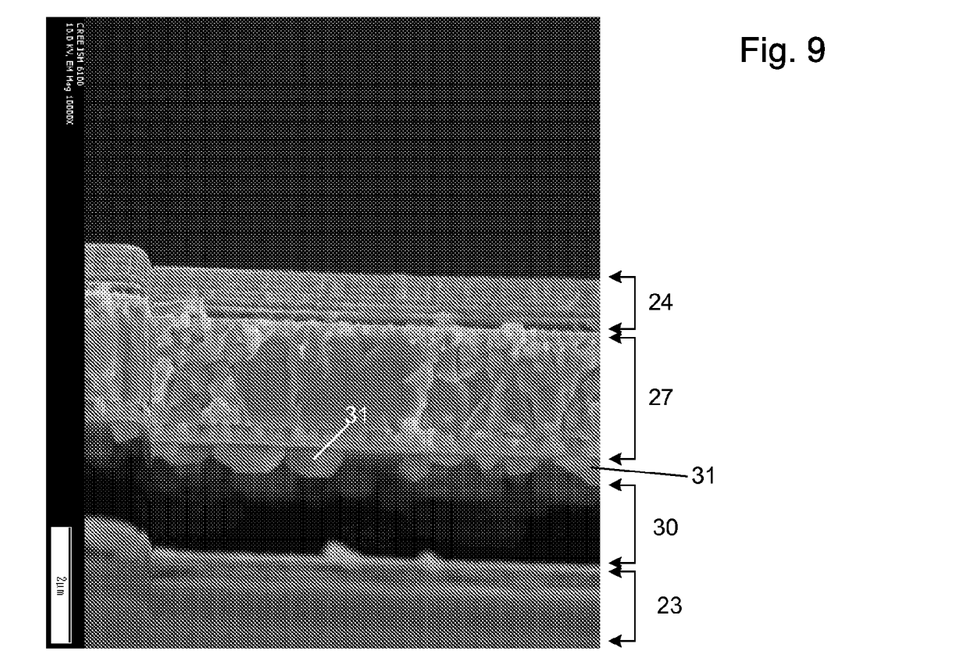
FIGS. 9 and 10 are photographs of LED structures with nickel-tin bonding systems.
Figure 10:
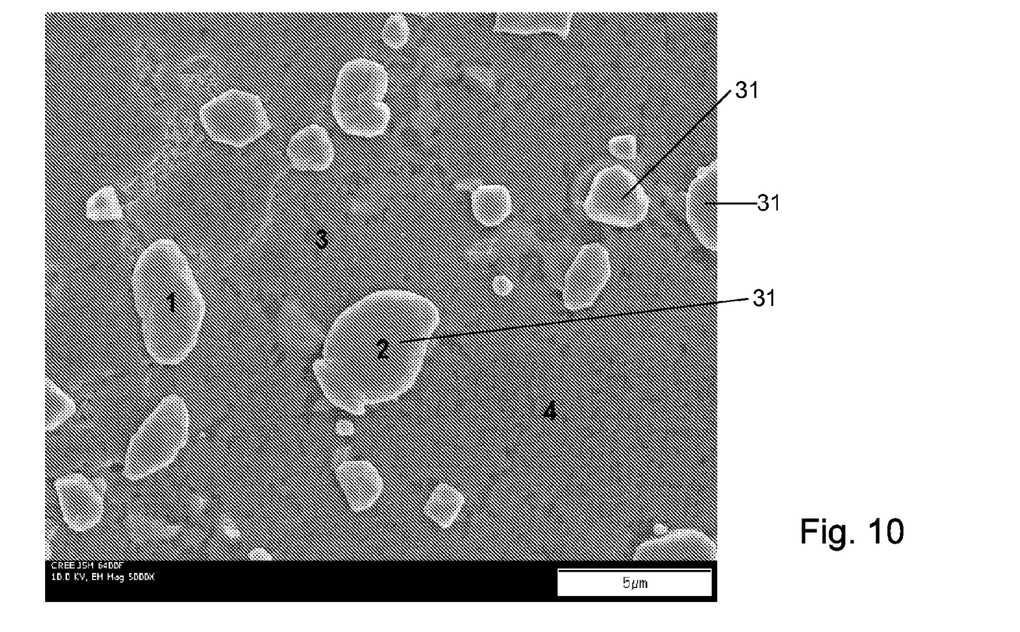

FIGS. 9 through 12 illustrate a different aspect of the same problem, namely the presence of significant amounts of free tin. Where appropriate, similar portions of the structure carry similar numerals as in the earlier figures. FIG. 9 is a cross sectional view of a structure from which the epitaxial layers have been removed in order to analyze the bonding structure. Thus, the metal barrier layers are again designated at 24 and the nickel-tin bonding system at 27. The void created by delamination is again labeled at 30 and the silicon carrier substrate at 23. FIG. 9 also illustrates, however, a plurality of portions of free tin 31. FIG. 10 is a plan view of the delaminated surface of the bonding layer 27.

Figure 11:
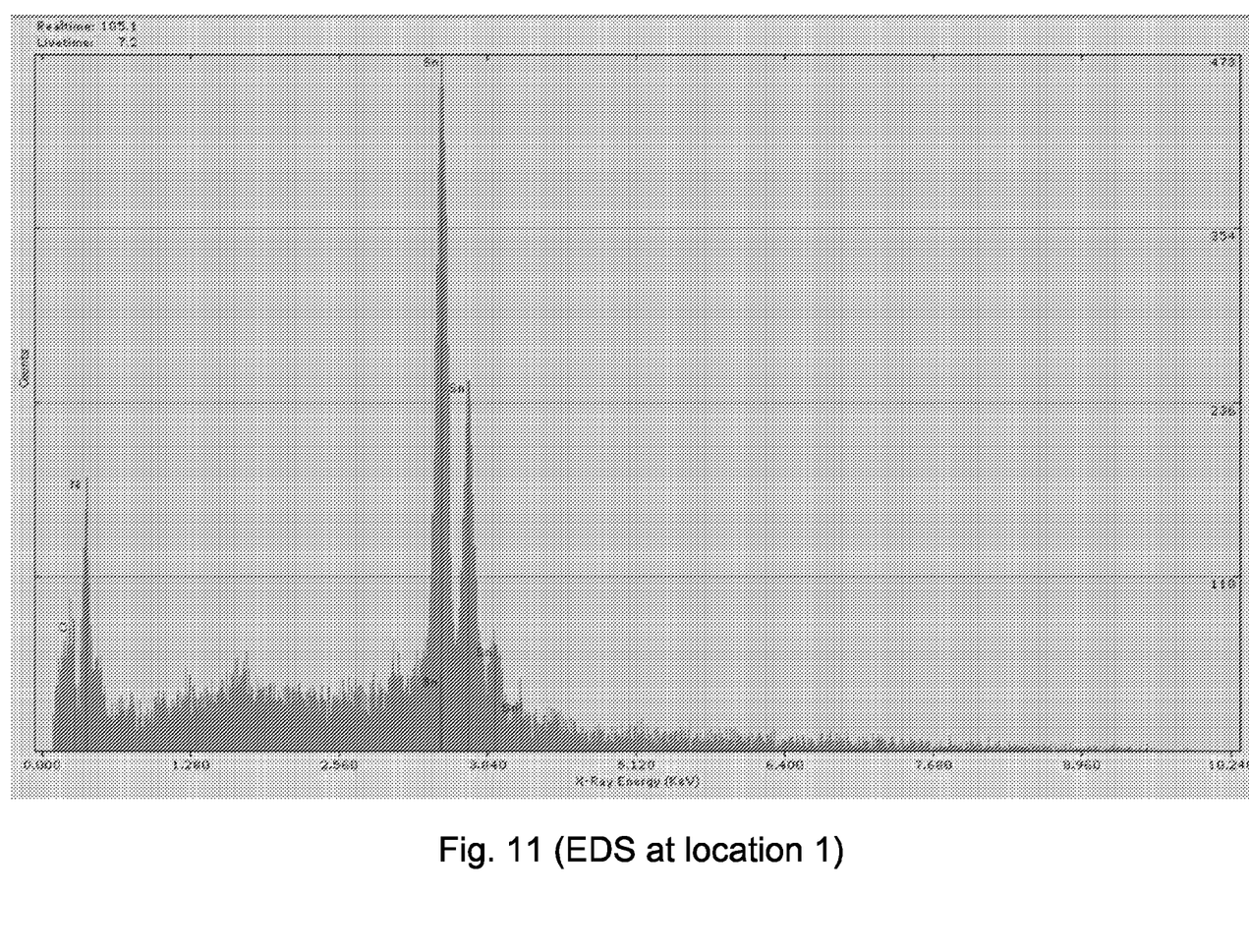
FIGS. 11-12 are EDS spectra from two positions taken from the surface illustrated in the photograph of FIG. 10.
Figure 12:
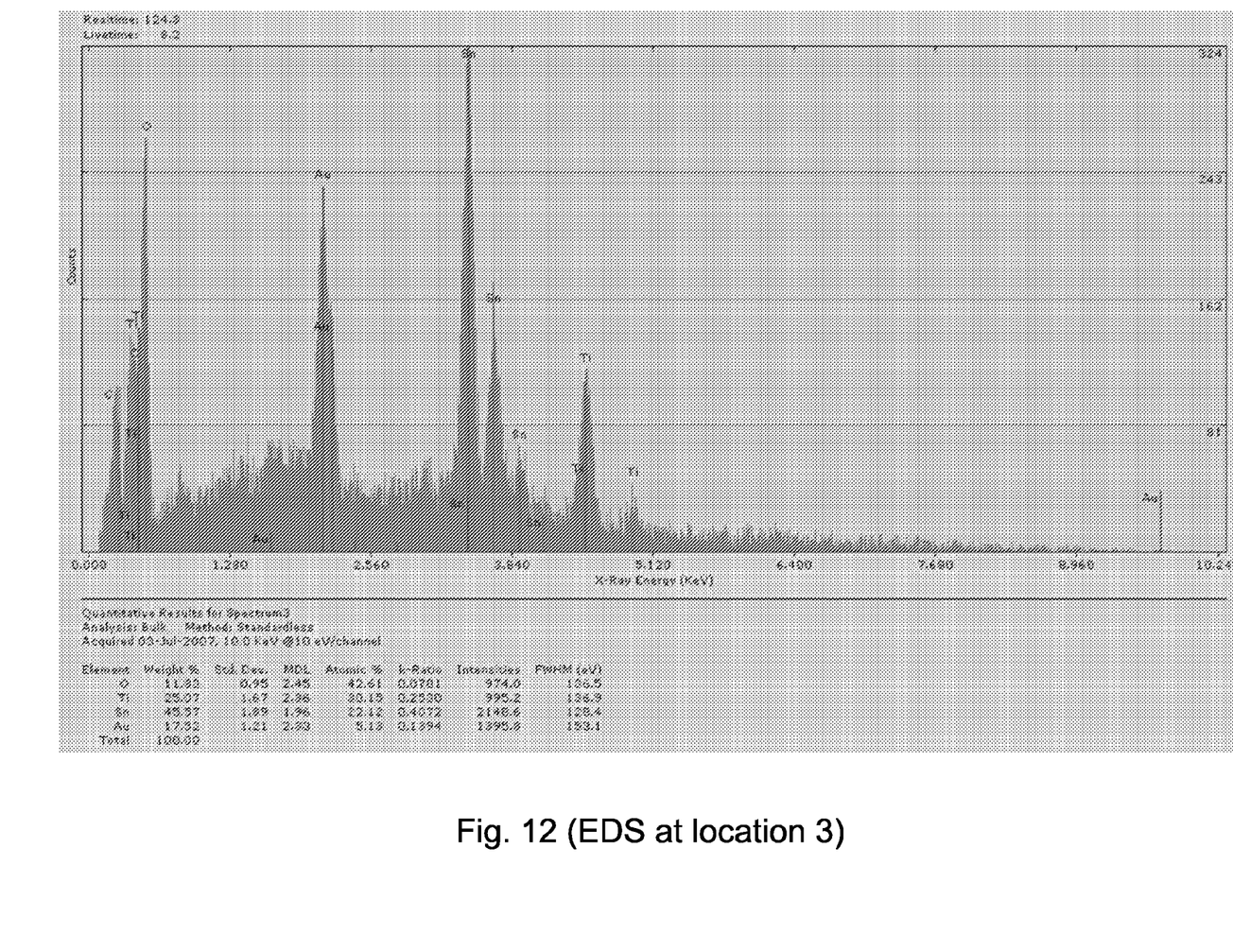

FIGS. 11 and 12 are EDS spectra that confirm that the portions designated at 31 are tin. FIG. 11 is an EDS spectra taken of the lump object designated "1" in FIG. 10. As FIG. 11 indicates, the sample is almost entirely tin without the presence of titanium or nickel.

When the same analysis is taken of the location labeled "3" (i.e., other than the lump structures), the spectra indicates the presence of gold, tin, and titanium, but again little or no nickel.

Figure 13:
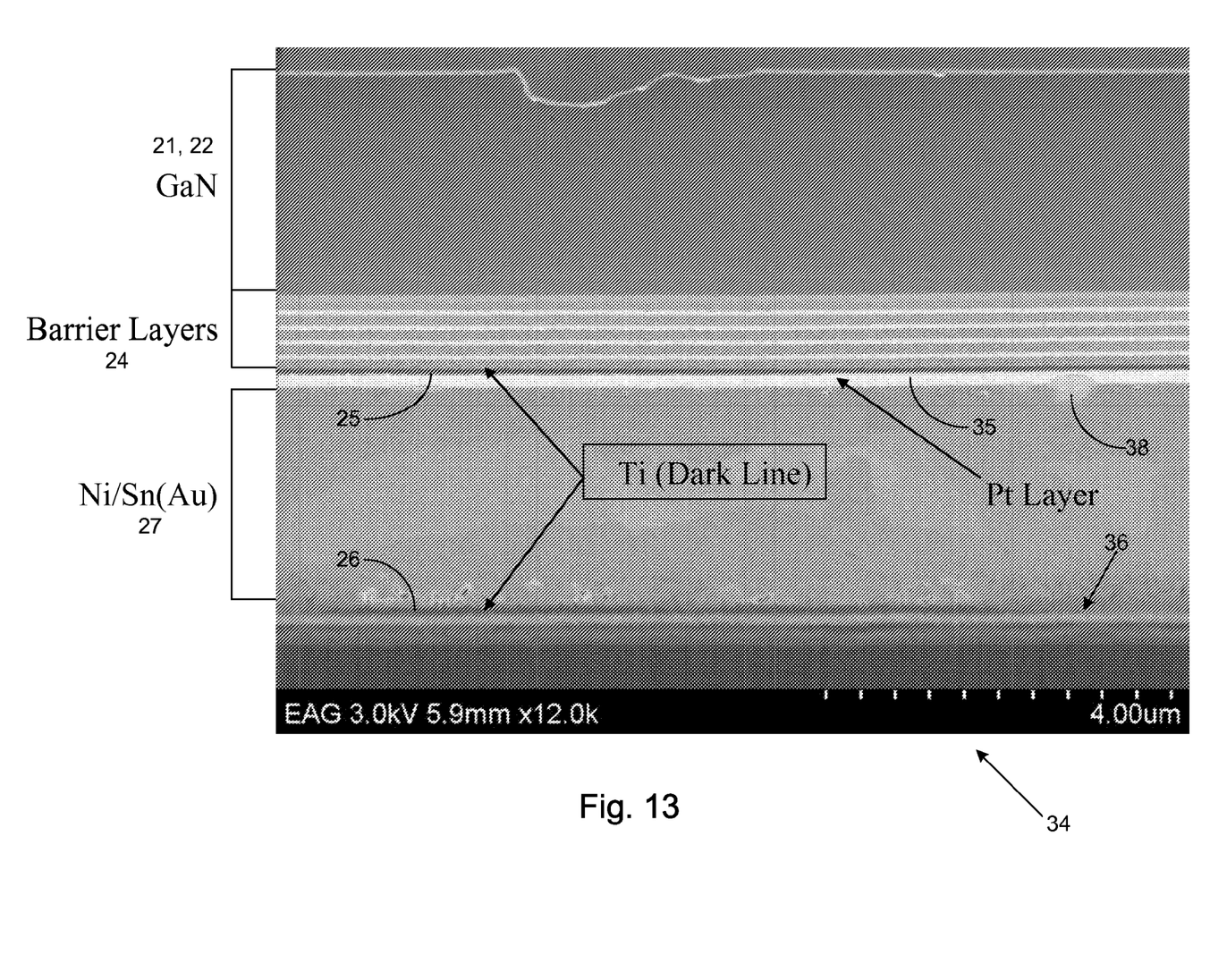
FIG. 13 is a cross-sectional photograph of a structure according to the present invention.

FIG. 13 is a cross-sectional micrograph of an LED structure according to the present invention broadly designated at 34 that includes the platinum barrier layer. Where appropriate, like elements carry the same reference numerals as in the earlier figures. Accordingly, the structure 34 includes two gallium nitride epitaxial layers 21, 22, although in the photographs they appear as a single layer. The barrier metal layers are again designated at 24, and the nickel tin bonding system (containing a small amount of gold) is again designated at 27. The titanium adhesion layers appear as the dark lines 25 and 26 on opposite sides of the nickel tin bonding system 27. The platinum barrier layer appears as the lighter line 35 above the nickel tin bonding system 27.

In preferred embodiments and as set forth in the '158 application, the amounts of nickel and tin are selected to make sure that all of the tin will react with nickel. In the most preferred embodiments, the amounts of nickel tin and any other elements present (e.g., gold) are such that a complete reaction takes place leaving behind little or no unreacted metal that can undergo diffusion, thermal aging, or any other disadvantageous processes over time.

Platinum represents an advantageous barrier metal because platinum can form intermetallic phases with any tin that reaches the platinum-tin interface. In this regard, it has been discovered that the barrier layer is most effective when it reacts with the tin. Thus, an effective barrier layer reacts with tin rather than merely blocking it from diffusing. These platinum-tin phases are stable within the temperature ranges at which the diodes undergo further fabrication and tend to remain stable during thermal aging. Stated differently, the presence of the platinum layer prevents formation of low melting point compounds, other thermally unstable intermetallic compounds, or tin migration to the adhesion interface opposite the nickel interface.

Those familiar with the fabrication of light emitting diodes will recognize that the characteristics of the barrier layers and related structures described herein are relevant in the context of the normal and expected length of time during which the diode will be exposed to any given temperature. In general, diodes of the type described herein will typically be exposed to steps such as chemical vapor deposition (to add passivation layers, etc.) at temperatures in the neighborhood of 200° C. for a time on the order of one hour. Various annealing processes (for example to obtain or improve ohmic contacts) take place at somewhat more elevated temperatures (e.g., about 290° C.) for periods of about an hour. Attaching a diode to a lead frame ("die attach") using a reflow process typically takes place at a higher temperature (315°-350° C.) for a shorter period of time; e.g., 5 or 10 seconds. Typical operating conditions are less than 50° C. High temperature (100° C.) operating lifetime has been demonstrated in excess of 1000 hours with no degradation of the bond.

Thus, it will be understood that the barrier layers and metal systems described herein maintain their desired properties for at least the time required to carry out these fabrication processes and typically much longer.

As the relatively clean appearance of the center portion of FIG. 13 indicates, the platinum barrier layer 35 prevents tin in the nickel-tin bonding system 27 from migrating to or through the titanium layer 25. Accordingly, FIG. 13 is exemplary of a structure that avoids the type of delamination visible in (for example) FIGS. 1 and 9.

Although titanium adhesion layers are frequently present on both the carrier side and the epitaxial side of the bonding metal system, the invention offers its advantages even in the absence of titanium; i.e., in structures where other adhesion layers known to those skilled in the art are used, or where platinum can act as the adhesion layer, or where an adhesion layer is not included.

FIG. 13 also illustrates the problem solved by the platinum barrier layer 35. In particular, in the portion of the photograph of FIG. 13 that is labeled with the arrow at 36, the titanium adhesion layer 26 tends to disappear into or otherwise be obscured by the nickel-tin bonding system 27. This is further evidence that, in the absence of the platinum barrier layer, the tin in the nickel tin bonding system 27 will migrate either into or through (or both) the titanium layer 26 and form low melting point titanium-tin compounds, other thermally unstable intermetallic compounds, or free tin.

FIG. 13 also includes an area labeled at 38 that illustrates the onset of localized interaction of the platinum layer 35 at temperatures of about 330° C. The titanium layer 25 remains well-defined above the area 38. When the structure of FIG. 13 is heated further (e.g., to about 350° C.) more such localized interaction has been observed.

In exemplary embodiments, the localized interactions between platinum and tin (e.g., region 38 in FIG. 13) tend to become more significant at bonding temperatures approaching about 330° C. and under the amount of force being applied (typically on the order of about 6500 Newtons). At lower temperatures, such as about 2400 degrees centigrade, the localized interactions between platinum and tin are not evident. Accordingly, a practical bonding temperature range starts at about the melting point of tin (232° C.) up to about 3500 degrees centigrade, with a preferred range being between about 240° and 330° C.

The barrier layer offers structural advantages on the epitaxial side of the metal bonding system, or on the carrier substrate side, or both. Thus, the invention includes all three possibilities. As a general observation to date (rather than a limitation of the invention) diodes without the barrier tend to delaminate on the epitaxial side more than on the carrier substrate side.

FIG. 13 also illustrates that the invention has advantages in the context of the thickness of the bond line because the barrier layer make a thinner bond line more practical. The term "bond line" is generally well-understood in the art and as used herein refers to the metal bonding system 27. In the invention, the bond line is typically less than 6 microns ($\mu$m) thick with exemplary embodiments being less than 3 $\mu$m thick. The thin bond line offers several advantages such as reduced fabrication costs and reduced stress in the metal system. In comparison, high stress can create a relatively high degree of wafer bowing particularly when employed in a thin (e.g., less than 150 $\mu$m) wafer. Such bowing can increase the difficulty of later fabrication and processing. Wafer bowing can also cause processing difficulty in thicker wafers (e.g., about 600 $\mu$m) during steps such as maintaining a vacuum on a chuck or photolithography. A number of different factors can, of course, influence wafer stress, (e.g., bonding temperature, bonding pressure, deposition technique), but the invention provides the opportunity to minimize the bond line thickness and thus minimize any stress caused by excess bond line thickness.

As noted earlier, the platinum barrier layer (35 in FIG. 13) precludes the movement of tin beyond the barrier layer 35. This enables the tin to be constrained by the platinum barrier layer 35 rather than by simply increasing the amount of nickel present in the bonding layer 27 (and thus avoiding increasing the bond line thickness).

Figure 14:
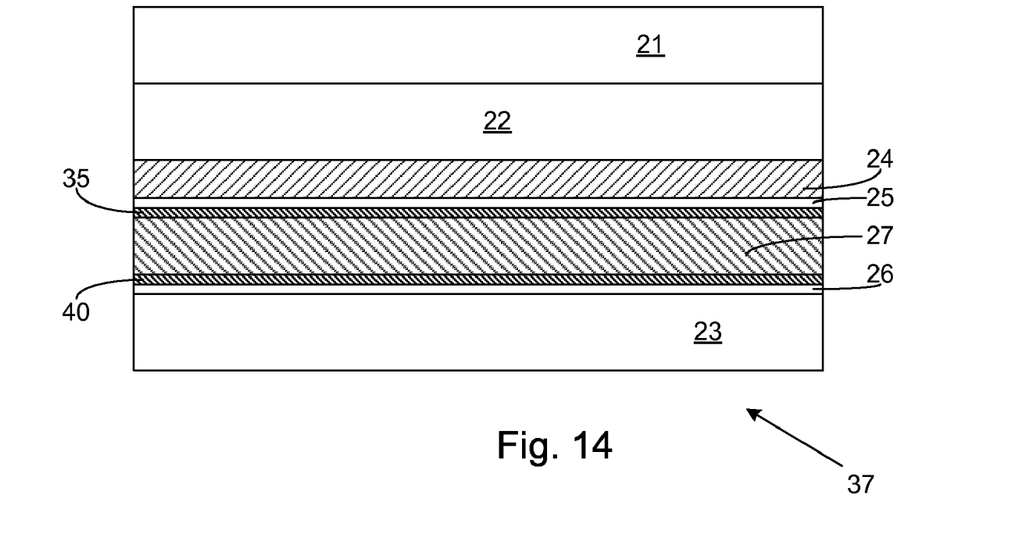
FIG. 14 is a cross-sectional schematic view of a structure according to the present invention.

FIG. 14 is a schematic diagram of a light emitting diode according to the invention broadly designated at 37 that includes the elements illustrated in FIG. 13, but also illustrating a second platinum barrier layer on the carrier wafer side of the device. The gallium nitride layers are again indicated at 21 and 22, the metal barrier layers at 24, and the substrate at 23. The titanium adhesion layers are illustrated at 25 and 26 on opposite sides of the nickel-tin bonding system 27.

FIG. 14 includes the platinum barrier layer 35 illustrated in FIG. 13, and also includes a second platinum barrier layer 40 on the carrier substrate side of the device 37.

In exemplary embodiments of the invention the bonding metal system 27 is a metal alloy that is more than 75 percent nickel and tin and in some cases more than 85 percent nickel and tin. If present, gold is limited, with exemplary embodiments containing less than 50 percent by weight gold and more typically less than 20 percent by weight gold.

Figure 15:
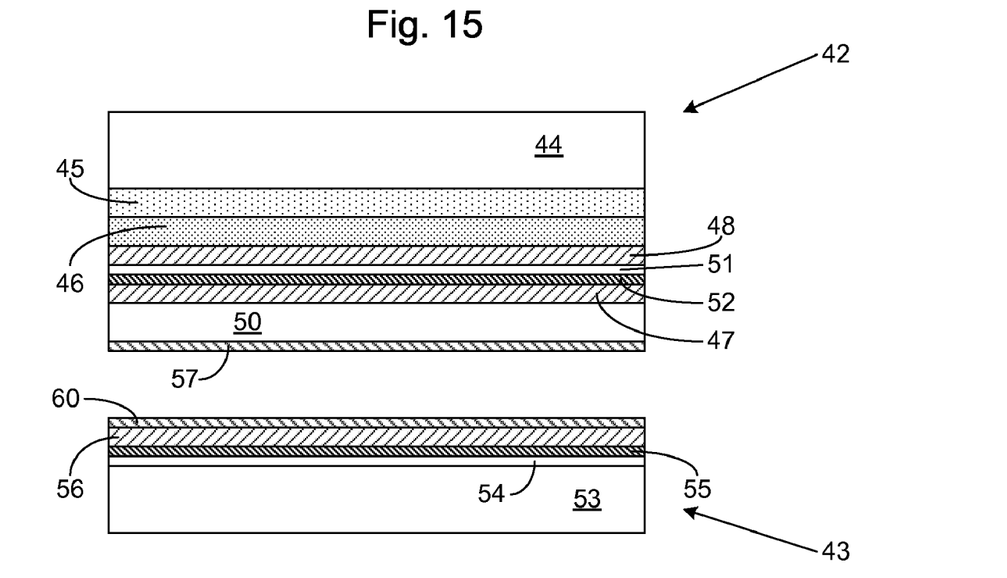
FIG. 15 is a cross-sectional schematic view of another embodiment of a structure according to the present invention.

FIG. 15 illustrates the invention in the context of a precursor growth structure broadly designated at 42 and a carrier structure broadly designated at 43. The growth structure 42 includes a growth substrate 44 which in exemplary embodiments is formed of silicon carbide because its lattice match with the Group III nitrides is better than that of other substrate materials such as sapphire. The growth structure 42 includes Group III nitride epitaxial layers 45 and 46 which in exemplary embodiments are formed of gallium nitride, but as noted earlier can include InGaN and can also include more complex structures such as heterojunctions, double heterojunctions, quantum wells, multiple quantum wells, and superlattice structures.

The barrier metals typically present are designated at 48.

The growth structure 42 includes a metal bonding system on the epitaxial layers 45 and 46 for joining the growth structure 42 to the carrier structure 43. The growth structure metal bonding system is formed predominantly of a layer of nickel 47 and a layer of tin 50 with an adhesion layer of titanium 51 between the nickel layer 47 and the epitaxial layers 45, 46 and a platinum barrier layer 52 between the titanium adhesion layer 51 and the nickel layer 47.

The carrier structure 43 includes a carrier substrate 53 typically selected from the group consisting of silicon and silicon carbide, a second titanium adhesion layer 54 on the carrier substrate 53, a second platinum barrier layer 55 on the second titanium layer 54 and a second nickel layer 56 on the second platinum layer 54 for joining the carrier structure 43 to the growth structure 42.

When the bonding metal system on the growth structure 42 and the nickel layer on the carrier structure 43 are joined and heated, the respective platinum barrier layers 52 and 54 prevent tin from the layer 50 from migrating into or through either of the titanium adhesion layers 51 or 54.

FIG. 15 also illustrates that in this embodiment the growth structure 42 and the carrier structure 43 can each include a flash layer of gold for improving the bond when the structures are joined. The growth structure 42 has a flash layer of gold 57 on the tin layer 50 and the carrier structure 43 has a flash layer of gold 60 on the second nickel layer 56.

In exemplary embodiments, the thickness of the tin layer 50 in the growth structure 42 is between about five and 10 times the thickness of the nickel layer 47 in the growth structure 42.

In exemplary embodiments, which are illustrative rather than limiting of the claimed invention, the layers on the growth structure 42 have the following thicknesses: the titanium adhesion layer 51 is approximately 100 nanometers, the platinum barrier layer 52 is approximately 150 nanometers, the nickel layer 47 is approximately 200 nanometers, the tin layer 50 is 2 microns thick, and the gold flash layer 57 is 30 nanometers.

On the corresponding carrier structure 43 the titanium adhesion layer 54 is 100 nanometers, the platinum barrier layer 54 is 1500 angstroms, the nickel layer 56 is 300 nanometers, and the gold flash layer 60 is 5 nanometers.

In another embodiment (not shown) an additional layer of about 100 nanometers of gold is positioned on the growth structure 42 between the 2 micron layer of tin and the 200 nanometer layer of nickel.

In other embodiments, the amount of nickel in either the growth structure 42 or the carrier structure 43 can be increased to 300 or 400 nanometers depending upon the desired final structure and composition.

As set forth in the '158 application, the respective structures 42 and 43 illustrated in FIG. 15 are heated when placed together under moderate pressure to form the bonded structure. Thereafter the growth substrate 44 can be thinned or removed depending upon design choice.

Figure 16:
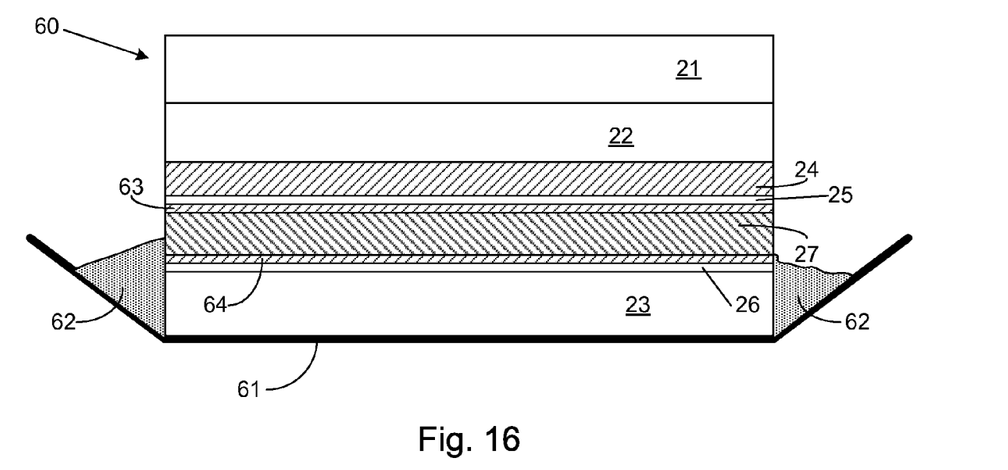
FIG. 16 is a cross-sectional schematic view of another embodiment of the present invention.

FIG. 16 illustrates the invention in the context of a lead frame. As in certain of the other drawings, previously-referenced elements carry the same reference numerals as they did in the other drawings.

Accordingly, FIG. 16 illustrates a light emitting diode structure broadly designated at 60. The structure 60 includes a light emitting portion formed of the epitaxial layers 21 and 22. A carrier substrate 23 supports the epitaxial layers 21 and 22. The carrier substrate is attached to a lead frame 61 with a solder composition 62. It will be understood that the lead frame and solder composition are illustrated schematically and in representative fashion, and that light emitting diodes are attached in the same or analogous manners to other fixtures and that such other analogous and equivalent structures fall within the scope of the invention.

A bonding metal system 27 joins the epitaxial layers 21 and 22 to the carrier substrate 23. A barrier layer 63 is positioned between the bonding metal system 27 and epitaxial layers 21, 22. The barrier layer 63 is formed of a material and has a thickness sufficient to substantially preclude the formation or migration of free metals or alloys that have melting points lower than the melting point of the solder composition 62, or that demonstrate thermal instability at such temperatures.

As set forth with respect to the previous embodiments, when the metal bonding system 27 predominates in nickel and tin, platinum serves as an exemplary barrier layer. As also set forth with respect to the other embodiments, the diode structure 60 typically also includes an adhesion layer 25 between the metal bonding system 27 and the epitaxial layers 21, 22 and with the platinum barrier layer 63 being positioned between the adhesion layer 25 and the nickel-tin bonding system 27. As in the other exemplary embodiments, the adhesion layer includes titanium because of its favorable properties for this purpose.

FIG. 16 also illustrates the barrier metal system 24 that is conventionally (but not necessarily) used in the structure along with a second titanium adhesion layer 26 immediately adjacent the carrier substrate 23 and an additional platinum barrier layer 64 between the bonding metal system 27 and the second adhesion layer 26 for likewise preventing free metals or alloys with low melting points (tin in particular) or other thermally unstable intermetallic compounds from forming or migrating to or through the titanium adhesion layer 26 at the carrier substrate. As noted earlier, however, if the barrier layer also provides satisfactory adhesion properties, the specific titanium adhesion layer may be omitted.

In the drawings and specification there has been set forth a preferred embodiment of the invention, and although specific terms have been employed, they are used in a generic and descriptive sense only and not for purposes of limitation, the scope of the invention being defined in the claims.

The invention claimed is:
1. A light emitting diode structure comprising:
a light emitting active portion formed of epitaxial layers;
a carrier substrate for supporting said active portion;
a bonding metal system that predominates in nickel and tin joining said active portion to said carrier substrate; and
at least one barrier layer adjacent said bonding metal system that predominates in nickel and tin, said barrier layer having a composition and a thickness sufficient to sub- stantially prevent tin in said bonding metal system that predominates in nickel and tin from migrating through said barrier layer;

wherein said bonding metal system includes gold in an amount greater than 0.3 percent and less than 36 percent by weight of said bonding metal system.

2. A light emitting diode structure according to claim 1 wherein said barrier layer is platinum.

3. A light emitting diode structure according to claim 2 further comprising at least one adhesion layer between said active portion and said platinum barrier layer.

4. A light emitting diode structure according to claim 3 wherein said adhesion layer comprises titanium.

5. A light emitting diode structure according to claim 4 further comprising:
   a second titanium adhesion layer between said bonding metal system and said carrier substrate; and
   a second platinum barrier layer between said second titanium adhesion layer and said bonding metal system.

6. A light emitting diode structure according to claim 2 wherein said bonding metal system comprises a metal alloy that is more than 85 percent nickel and tin.

7. A light emitting diode structure according to claim 1 wherein said barrier layer can form intermetallic compounds with tin that are thermally stable within the temperature range of between about 240° and 350° C.

8. A light emitting diode structure according to claim 1 wherein said bonding metal system is a metal alloy that contains gold in an amount of less than 20 percent by weight.

9. A light emitting diode structure according to claim 1 wherein said light emitting active portion is formed from the Group III nitride material system.

10. A light emitting diode structure according to claim 9 wherein said active portion comprises gallium nitride.

11. A light emitting diode structure according to claim 1 wherein said carrier substrate is selected from the group consisting of aluminum, copper, silicon and silicon carbide.

12. A light emitting diode structure according to claim 1 wherein said bonding metal system is less than 6 microns thick.

13. A light emitting diode structure according to claim 1 wherein said bonding metal system is less than 3 microns thick.

14. A light emitting diode structure comprising:
   a light emitting active portion formed of epitaxial layers;
   a carrier substrate for supporting said active portion;
   a bonding metal system that predominates in nickel and tin joining said active portion to said carrier substrate; and
   a barrier layer between said bonding metal system and said epitaxial layers, said barrier layer being formed of a material and having a thickness sufficient to substantially preclude the formation or migration of free metals or alloys that have melting points lower than 300° C.;
   wherein said bonding metal system includes gold in an amount greater than 0.3 percent and less than 36 percent by weight of said bonding metal system.

15. A light emitting diode structure according claim 14 wherein said barrier layer includes platinum.

16. A light emitting diode structure according to claim 15 and further comprising an adhesion layer between said bonding metal system and said light emitting active portion and with said platinum barrier layer between said adhesion layer and said bonding metal system.

17. A light emitting diode according to claim 16 wherein said adhesion layer includes titanium.

18. A light emitting diode structure according to claim 14 wherein said bonding metal system is less than 6 microns thick.

19. A light emitting diode structure according to claim 14 wherein said bonding metal system is less than 3 microns thick.

20. A light emitting diode structure according to claim 14, comprising a lead frame attached to said carrier substrate with a solder composition.

* * * * *